(12) United States Patent
Boettcher et al.

(10) Patent No.: US 9,461,183 B2
(45) Date of Patent: Oct. 4, 2016

(54) DIODE HAVING A REDUCED SURFACE FIELD EFFECT TRENCH STRUCTURE AND METHOD OF MANUFACTURING A DIODE HAVING A REDUCED SURFACE FIELD EFFECT TRENCH STRUCTURE

(71) Applicant: NXP B.V., Eindhoven (NL)

(72) Inventors: Tim Boettcher, Lauenbrueck (DE); Jan Fischer, Lueneburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/499,654

(22) Filed: Sep. 29, 2014

(65) Prior Publication Data

US 2015/0091023 A1 Apr. 2, 2015

(30) Foreign Application Priority Data

Oct. 2, 2013 (EP) .................................. 13187183

(51) Int. Cl.
*H01L 29/15* (2006.01)
*H01L 31/0312* (2006.01)
*H01L 29/872* (2006.01)
*H01L 29/165* (2006.01)
*H01L 21/283* (2006.01)
(Continued)

(52) U.S. Cl.
CPC ......... *H01L 29/8725* (2013.01); *H01L 21/283* (2013.01); *H01L 29/161* (2013.01); *H01L 29/165* (2013.01); *H01L 29/407* (2013.01); *H01L 29/66136* (2013.01); *H01L 29/66143* (2013.01); *H01L 29/861* (2013.01); *H01L 29/872* (2013.01); *H01L 29/401* (2013.01); *H01L 29/45* (2013.01); *H01L 29/47* (2013.01)

(58) Field of Classification Search
CPC ........... H01L 29/7824; H01L 29/7394; H01L 29/0653; H01L 29/42368; H01L 29/1608; H01L 29/66068; H01L 29/1602; H01L 29/7802; H01L 29/6606; H01L 29/2003; H01L 29/66462; H01L 29/0847; H01L 29/7787; H01L 29/7783; H01L 29/802
USPC .................. 257/77, 192, 492–493, E29.056, 257/E29.202, E29.197, E29.02; 438/586, 438/140, 268, 286, 296, 138, 135
See application file for complete search history.

(56) References Cited

U.S. PATENT DOCUMENTS 5,365,102 A 11/1994 Mehrota et al.
5,612,567 A 3/1997 Baliga
(Continued)

FOREIGN PATENT DOCUMENTS

WO 97/43789 11/1997
WO 02/063694 A1 8/2002

OTHER PUBLICATIONS

Hurkx, G.A.M. et al; "Low-Voltage SiGe Power Diodes"; Proceedings of the 2001 Int'l Symposium on Power Semiconductor Devices & IDs; Osaka Japan; pp. 239-242 (2002).
(Continued)

*Primary Examiner* — Robert Huber
*Assistant Examiner* — Nduka Ojeh

(57) ABSTRACT

A diode comprising a reduced surface field effect trench structure, the reduced surface field effect trench structure comprising at least two trenches formed in a substrate and separated from one another by a joining region of the substrate, the joining region comprising an electrical contact and a layer of p-doped semiconductor material.

14 Claims, 6 Drawing Sheets

(51) Int. Cl.
*H01L 29/66* (2006.01)
*H01L 29/861* (2006.01)
*H01L 29/161* (2006.01)
*H01L 29/40* (2006.01)
*H01L 29/45* (2006.01)
*H01L 29/47* (2006.01)

(56) References Cited

U.S. PATENT DOCUMENTS

| | | | |
|---|---|---|---|
| 6,303,969 | B1 | 10/2001 | Tan |
| 7,943,471 | B1* | 5/2011 | Buller et al. ............... 438/379 |
| 2002/0005558 | A1 | 1/2002 | Brown et al. |
| 2002/0121678 | A1* | 9/2002 | Huang ........................ 257/656 |
| 2002/0155690 | A1* | 10/2002 | Cabral et al. .............. 438/596 |
| 2005/0104134 | A1* | 5/2005 | Kato .......................... 257/382 |
| 2006/0255402 | A1* | 11/2006 | Hshieh et al. .............. 257/330 |
| 2007/0134882 | A1* | 6/2007 | Hsieh ............... H01L 29/66727 438/361 |
| 2008/0067607 | A1* | 3/2008 | Verhulst et al. ........... 257/371 |
| 2008/0230833 | A1* | 9/2008 | Zundel et al. ............. 257/330 |
| 2012/0220100 | A1* | 8/2012 | Herner ....................... 438/381 |
| 2013/0132913 | A1* | 5/2013 | Fu et al. ..................... 716/51 |

OTHER PUBLICATIONS

Brown, A.R. et al; "SiGe Fast-Switching Power Diodes";Technical Digest, Int'l Electron Devices Meeting 1998, San Francisco, CA, USA; IEEE; pp. 699-702 (1998).

Ma, Li et al; "A novel type of ultra fast and ultra soft recovery SiGe/Si heterojunction power diode with an ideal ohmic contact"; Chinese Physics, vol. 13, No. 7; 6 pages (Jul. 2004).

Ma, Li et al; "A super junction SiGe low-loss fast switching power diode"; Chinese Physics B, vol. 18 No. 1; 2009 Chin. Phys. Soc. and IOP Publishing Ltd; 6 pages (Jan. 2009).

Liu Jing et al; "Research on a Novel Structure of SiGeC/Si Heterojunction Power Diodes"; IEEE $5^{th}$ Intl. Power Electronics and Motion Control Conference, Shanghai, CN; pp. 1-4 (Aug. 14, 2006).

Rebolo, Jose et al; "A Review of Si MOS-gated Power Switches and PiN Rectifiers"; Automatika 53, No. 2; pp. 117-127 (2012).

Boksteen, B.K. et al; "An Initial study on the Reliability of Power Semiconductor Devices"; STW.ICT Conference 2010, Nov. 18-19, 2010, Veldhoven, NL; 6 pages (Nov. 2010).

Gao, Yong, et al; "Analysis and Optimal Design of a Novel SiGe/Si Power Diode for Fast and Soft Recovery"; Chin. Phys. Lett., vol. 21, No. 2; 4 pages (2004).

Extended European Search Report for application No. 13187183.2 (Sep. 2, 2014).

* cited by examiner

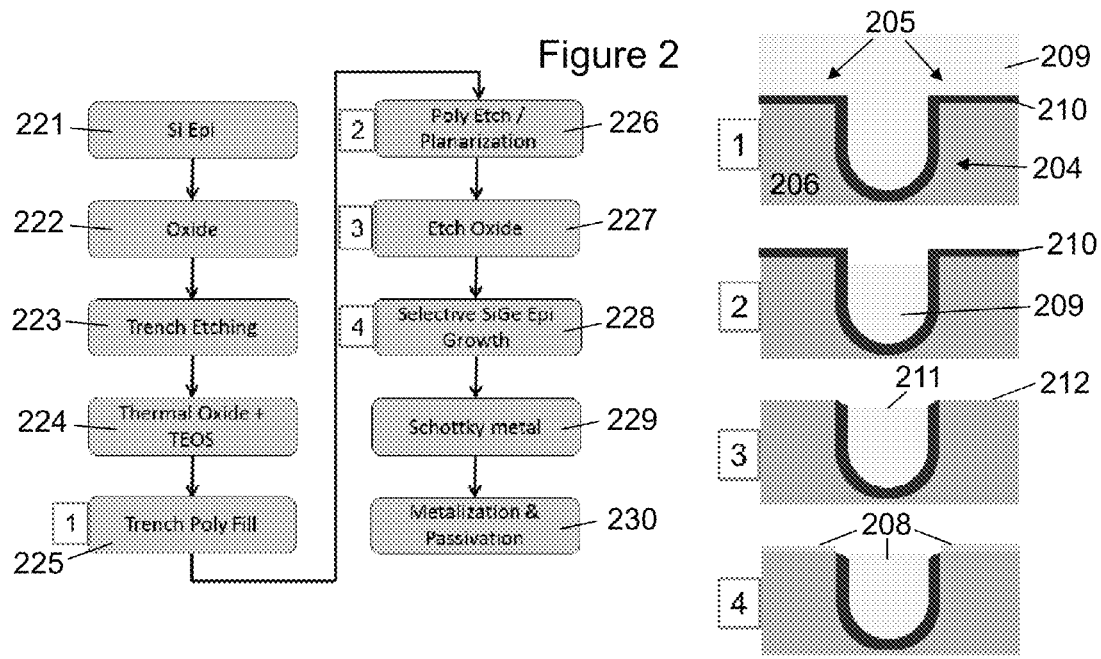
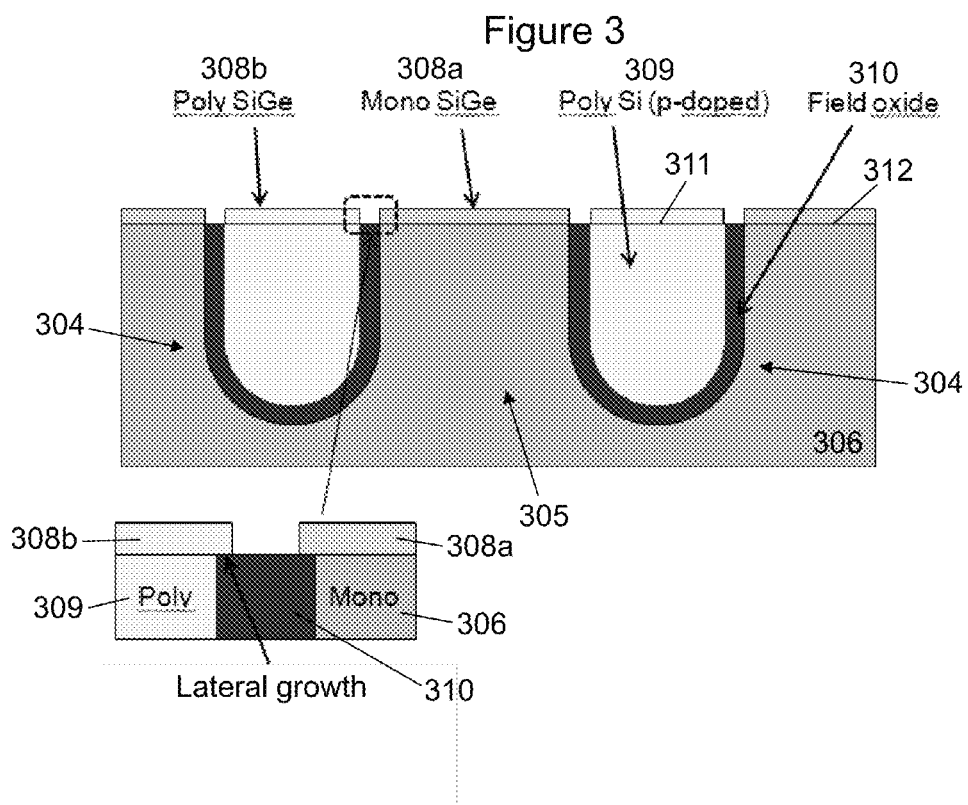

Figure 4
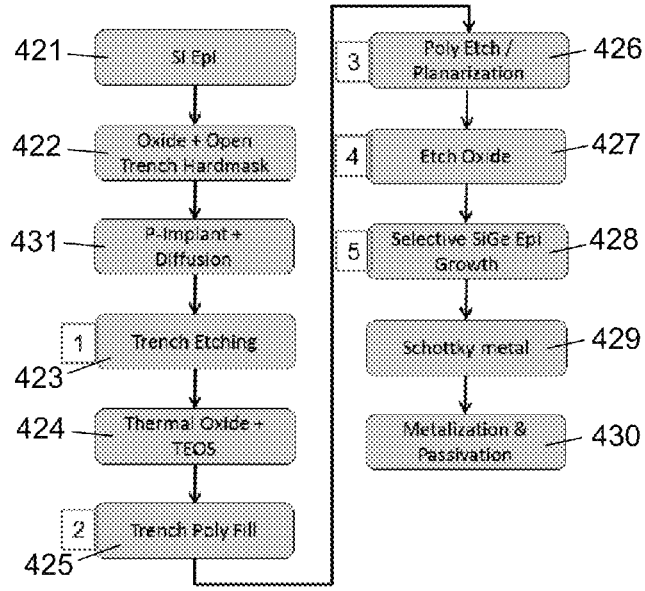
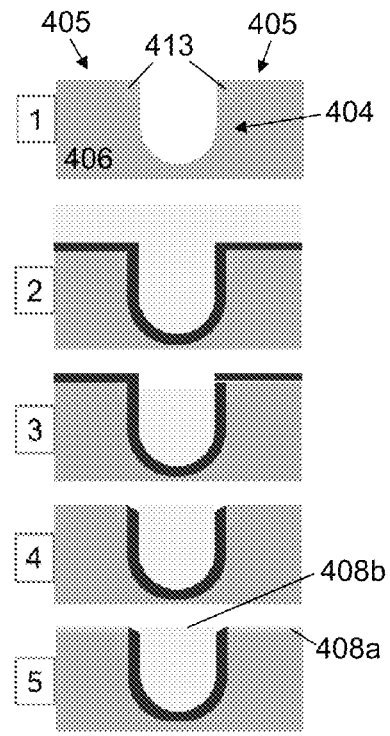
Figure 5
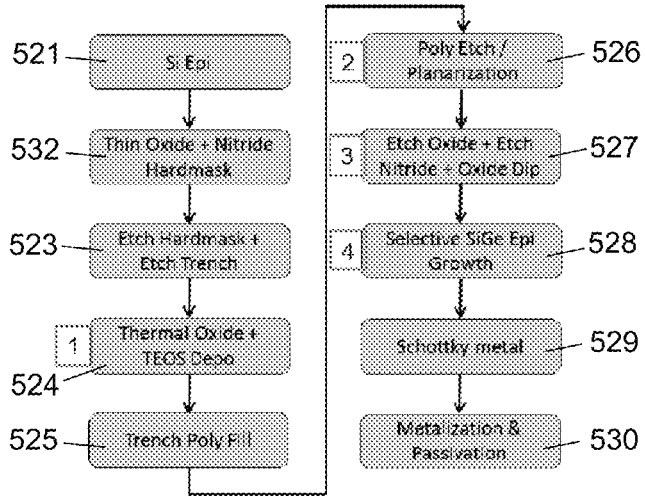
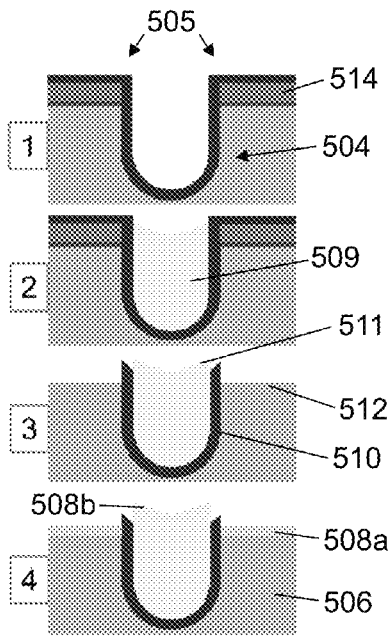

DIODE HAVING A REDUCED SURFACE FIELD EFFECT TRENCH STRUCTURE AND METHOD OF MANUFACTURING A DIODE HAVING A REDUCED SURFACE FIELD EFFECT TRENCH STRUCTURE

CROSS-REFERENCE TO RELATED APPLICATIONS

This application claims the priority under 35 U.S.C. §119 of European patent application no. 13187183.2, filed on Oct. 2, 2013, the contents of which are incorporated by reference herein.

The present disclosure relates to the field of diodes, and in particular a diode comprising a reduced surface field effect trench structure in which a layer of p-doped semiconductor material is formed in the mesa regions of the reduced surface field effect trench structure.

Planar silicon germanium power diodes are unipolar rectifier devices, that is, transport in the devices can be attributed primarily to the electrons. The specific on-resistance (or resistivity) of such devices decreases with increasing doping concentration in the active epitaxial layer, but so too does the off-state breakdown voltage. There is therefore a trade-off between the resistivity and breakdown voltage, commonly referred to as the 1D silicon limit. Typically, the doping concentration is dictated by the target breakdown voltage resulting in a greater resistivity than desired. The greater resistivity increases the forward voltage, which in turn increases power losses and reduces the switching speed.

According to a first aspect, there is provided a diode comprising a reduced surface field effect trench structure, the reduced surface field effect trench structure comprising at least two trenches formed in a substrate and separated from one another by a joining region of the substrate, the joining region comprising an electrical contact and a layer of p-doped semiconductor material.

This structure has been found to enable higher dopant concentrations to be used without causing a reduction in the breakdown voltage, advantageously resulting in a diode with lower resistivity, forward voltage and power losses with respect to existing silicon germanium diodes. In addition, diodes with the present structure exhibit faster switching and a lower (up to an order of magnitude) leakage current.

The term "diode" as used herein may be interpreted to mean any apparatus configured to allow a flow of electrical current in one direction and prevent a flow of electrical current in the opposite direction. In this respect, the term "diode" may be considered to encompass the reduced surface field effect trench structure as defined above with or without any additional layers or components. The diode may be a Schottky diode.

The joining region may be a mesa region of the substrate.

The at least two trenches may be separate trenches or different regions of the same trench (for example, a circular or meander trench).

The layer of p-doped semiconductor material may be formed (directly) on top of the substrate. The electrical contact may be formed (directly) on top of the layer of p-doped semiconductor material.

The layer of p-doped semiconductor material may comprise one or more of p-doped silicon germanium, p-doped silicon, p-doped silicon germanium carbide, and p-doped silicon carbide. The dopant may comprise boron.

The joining region may further comprise a layer of n-doped semiconductor material. The layer of p-doped semiconductor material may be formed (directly) on top of the layer of n-doped semiconductor material. The layer of p-doped semiconductor material and the layer of n-doped semiconductor material may have a combined thickness of no more than 40 nm. The layer of p-doped semiconductor material may comprise p-doped silicon germanium and the layer of n-doped semiconductor material may comprise n-doped silicon germanium.

The electrical contact may be a Schottky contact or an Ohmic contact. The electrical contact may comprise one or more of a metal, an alloy, and a silicide. The alloy may comprise one or more of tungsten titanium, titanium, titanium nitride and tungsten titanium nitride. The silicide may comprise one or more of cobalt silicide, nickel silicide, nickel iron silicide, and platinum nickel silicide.

The reduced surface field effect trench structure may comprise more than two trenches. Some or all adjacent trenches may be separated from one another by respective joining regions of the substrate each comprising an electrical contact and a layer of p-doped semiconductor material. The joining regions may further comprise a layer of n-doped semiconductor material as described above.

The substrate may comprise monocrystalline silicon. The substrate may comprise an epitaxial layer of monocrystalline silicon (e.g. an n-doped epitaxial layer of monocrystalline silicon) which may or may not be formed on top of a supporting (e.g. silicon) substrate. Each trench may comprise polycrystalline silicon separated from the monocrystalline silicon by a layer of silicon oxide. The monocrystalline silicon and polycrystalline silicon may each have an upper surface. The upper surface of the polycrystalline silicon may be positioned below the upper surface of the monocrystalline silicon. The silicon oxide may extend above the upper surfaces of the monocrystalline silicon and polycrystalline silicon. Each trench may comprise a guard collar termination region at the edge of the trench.

According to a further aspect, there is provided a method of making a reduced surface field effect trench structure for a diode, the method comprising:
  forming at least two trenches in a substrate separated from one another by a joining region of the substrate; and
  forming an electrical contact and a layer of p-doped semiconductor material at the joining region.

Forming the electrical contact and layer of p-doped semiconductor material at the joining region may comprise forming the layer of p-doped semiconductor material (directly) on top of the substrate and/or forming the electrical contact (directly) on top of the layer of p-doped semiconductor material.

The method may comprise forming a layer of n-doped semiconductor material at the joining region. Forming the layer of n-doped semiconductor material at the joining region may comprise forming the layer of n-doped semiconductor material (directly) beneath the layer of p-doped semiconductor material.

The substrate may comprise monocrystalline silicon. The method may comprise: forming a layer of silicon oxide on top of the monocrystalline silicon within the trenches; and providing polycrystalline silicon within the trenches such that the polycrystalline silicon is separated from the monocrystalline silicon by the silicon oxide. Providing the polycrystalline silicon within the trenches may comprise filling the trenches with polycrystalline silicon such that the upper surface of the polycrystalline silicon is positioned below the upper surface of the monocrystalline silicon. Forming the layer of silicon oxide may comprise forming the layer of silicon oxide such that the silicon oxide extends above the upper surfaces of the monocrystalline silicon and polycrystalline silicon The method may comprise forming a guard collar termination region at the edge of each trench.

The method may comprise forming the layer of p-doped semiconductor material before forming the at least two trenches and electrical contact.

Forming the electrical contact may comprise: forming a layer of silicon on top of the layer of p-doped semiconductor material; depositing a layer of metal on top of the layer of silicon; and optionally annealing the metal and silicon layers to form a monosilicide. Forming the electrical contact may comprise one or both of: etching any unreacted metal after forming the monosilicide; and annealing the monosilicide to form a disilicide. The p-doped semiconductor material may comprise p-doped silicon germanium and the metal may comprise one or more of nickel and cobalt.

The steps of any method disclosed herein do not have to be performed in the exact order disclosed, unless explicitly stated or understood by the skilled person.

Corresponding computer programs for implementing one or more steps of the methods disclosed herein are also within the scope of the present disclosure and are encompassed by one or more of the described example embodiments.

One or more of the computer programs may, when run on a computer, cause the computer to configure any apparatus, including a diode, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

Throughout the present specification, descriptors relating to relative orientation and position, such as "top", "bottom", "upper", "lower", "above" and "below", as well as any adjective and adverb derivatives thereof, are used in the sense of the orientation of the diode as presented in the drawings. However, such descriptors are not intended to be in any way limiting to an intended use of the described or claimed invention.

A description is now given, by way of example only, with reference to the accompanying drawings, in which:

BRIEF DESCRIPTION OF THE DRAWINGS

FIG. 2 illustrates schematically a method of making the diode of FIG. 1;

FIG. 3 illustrates schematically lateral growth of a p-doped semiconductor material between the trench and mesa regions;

FIG. 4 illustrates schematically another method of making a diode;

FIG. 5 illustrates schematically another method of making a diode;

Figure 1:
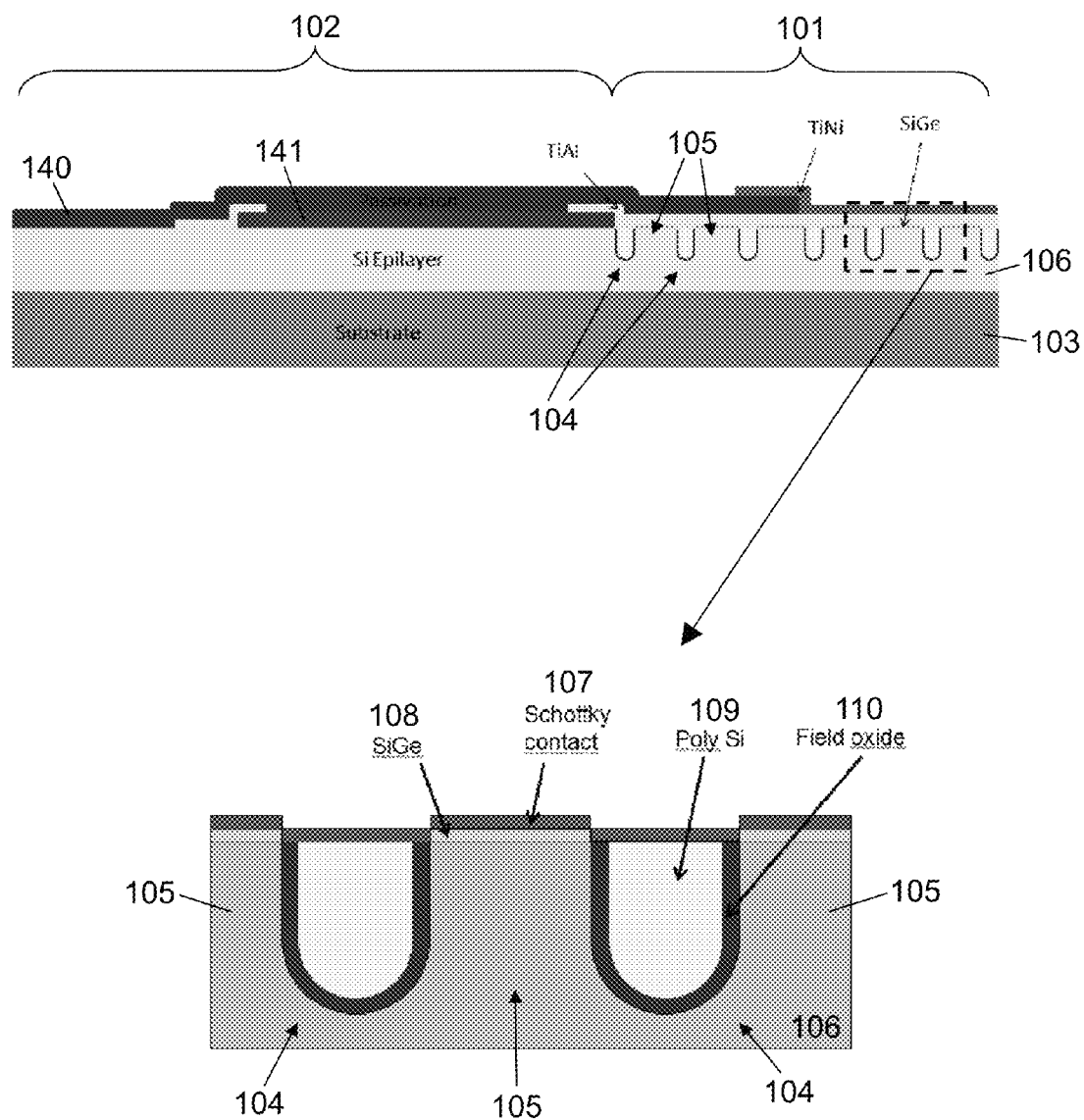
FIG. 1 illustrates schematically a diode comprising a reduced surface field effect trench structure.

As mentioned above, there is a trade-off between resistivity and breakdown voltage in planar silicon germanium diodes which can result in a greater resistivity and forward voltage than desired. One or more of the apparatus and associated methods described herein may address this issue.

Reduced surface (RESURF) field effect trench structures can be used in silicon Schottky diodes to enable an increase in the doping concentration of the active epitaxial layer without sacrificing the breakdown voltage of the device. Charge coupling between the trenches and mesa regions of the structure has been found to cause a redistribution of the electric field profile under the Schottky contact resulting in an increase in breakdown voltage and a reduction in reverse leakage current.

One or more examples disclosed herein involve the use of a modified RESURF trench structure in other types of diode, in particular, silicon germanium diodes.

Later examples depicted in the figures have been provided with reference numerals that correspond to similar features of earlier described examples. For example, feature number 1 can also correspond to numbers 101, 201, 301 etc. These numbered features may appear in the figures but may not be directly referred to within the description of these particular examples. This has been done to aid understanding, particularly in relation to the features of similar earlier described examples.

FIG. 1 shows a diode that comprises an active region 101 located between first 102 and second termination regions (although only the first termination region 102 is shown here) fabricated on top of a supporting substrate 103.

The active region 101 of the diode has a RESURF trench structure comprising at least two trenches 104 (seven trenches 104 are shown here) formed in a substrate 106 and separated from one another by joining regions 105 of the substrate 106. In the examples described herein, the substrate 106 is an n-doped epitaxial layer of monocrystalline silicon located on top of the supporting substrate 103, and the joining regions 105 are mesa regions of this monocrystalline silicon layer 106. The term "mesa" may be taken to mean a region of the substrate 106 having a substantially flat top and one or two (depending on whether it is located adjacent to or between the trenches, respectively) relatively steep sides. As shown in the magnified view of two adjacent trenches 104, each mesa region 105 comprises an electrical contact 107 and an epitaxial layer of p-doped semiconductor material 108 formed on the upper surface of the monocrystalline silicon substrate 106.

By positioning the electrical contact 107 and p-doped semiconductor material 108 at the mesa regions 105 between adjacent trenches 104, electrically conductive material 109 deposited within the trenches 104 (described in more detail below) can be used to influence the electric field within the mesa regions 105 to control the electrical properties of the diode.

In the example shown, the layer of p-doped semiconductor material 108 is a layer of p-doped silicon germanium and the electrical contact 107 is a metal alloy formed directly on top of the layer of silicon germanium 108. Nevertheless, other materials could be used for the p-doped semiconductor 108 and electrical contact 107. For example, the p-doped semiconductor 108 may comprise one or more of p-doped silicon, p-doped silicon germanium carbide, and p-doped silicon carbide (for example, doped with boron), whilst the electrical contact 107 may comprise one or more of a metal, an alloy (for example, tungsten titanium, titanium nitride and/or tungsten titanium nitride), and a silicide (for example, cobalt silicide, nickel silicide, nickel iron silicide and/or platinum nickel silicide). The above-mentioned alloys have been found to be less reactive than other metals/alloys with thin layers of silicon germanium and are therefore advantageous when silicon germanium is used as the p-doped semiconductor material.

In alternative examples, the mesa region(s) may comprise an epitaxial layer of n-doped semiconductor material in addition to the layer of p-doped semiconductor material such that a p-n junction is formed within the mesa region(s). For example, the epitaxial semiconductor may comprise a layer of p-doped semiconductor material (such as p-doped silicon germanium) formed directly on top of the layer of n-doped semiconductor material (such as n-doped silicon germanium).

To achieve a sufficiently low band gap, the epitaxial layer(s) of semiconductor material (p-doped and n-doped) should be at least partially (and preferably fully) strained. The term "strained" means that the epitaxial layers of semiconductor material have become elastically deformed in order to adapt to the different lattice constant of the underlying substrate without the formation of crystal defects. If the layers are too thick, however, the strain can relax and defects can start to hamper the functionality of the diode. This is because the built-in energy of a layer increases with thickness until it becomes energetically favourable to incorporate defects to release the strain, which also changes the band gap of the silicon germanium. The optimum thickness of the p-doped and n-doped layers will depend on the stoichiometry of the material (for example, the germanium fraction in silicon germanium), but in general for some applications, the combined thickness should not exceed 40 nm. In this respect, the layer of p-doped semiconductor may have a material thickness of 10-30 nm (in some examples about 20 nm) and the underlying layer of n-doped semiconductor material may have a material thickness of no more than 10 nm (in some examples about 5 nm).

In the examples described herein, the trenches are lined with a layer of electrically insulating material 110 (such as silicon oxide) and at least partially filled with an electrically conductive material 109 (such as polycrystalline silicon) to enable them to influence the electric field in the mesa region 105 located therebetween.

The termination region 102 in FIG. 1 comprises first 140 and second 141 passivation layers on top of the monocrystalline silicon substrate 106. The first 140 and second 141 passivation layers are configured to provide scratch and humidity protection to the underlying layers and limit the solderable area in case soft solder front contacts are used. In this example, the first passivation layer 140 comprises silicon nitride, but low-temperature plasma-deposited silicon oxide or silicon nitride may be used instead. In addition, the second passivation layer 102 comprises thermally grown silicon dioxide, but deposited material such as tetraethyl orthosilicate (TEOS) oxide is also suitable.

FIG. 2 shows one possible fabrication process for making the diode structure described above. The structural profile following certain steps is illustrated schematically in FIG. 2 to aid visualisation of the process. First, an epitaxial layer of monocrystalline silicon 206 is formed 221 on a supporting substrate. An oxide mask is then formed 222 on top of the epitaxial layer 206 to define the positions of the trenches 204, and the silicon is subsequently etched 223 to form the trenches 204, thereby defining the interconnecting mesa regions 205. Once the trenches 204 have been formed, a thermal oxide process 224 (such as a TEOS oxide process) is used to create an electrically insulating oxide layer 210 on top of the silicon 206, both in the trenches 204 and on the mesa regions 205, before an electrically conductive material 209 (polycrystalline silicon in this example) is deposited thereon 225. The structure at this stage of the process is shown as profile 1 on the right-hand side of FIG. 2.

The electrically conductive material 209 is then etched 226 to remove it from the mesa regions 205 of the structure and (preferably) create a planar upper surface 211 in the electrically conductive material 209 (profile 2), and the insulating oxide layer 210 is etched away 227 from the mesa regions 205 to expose the underlying monocrystalline silicon 206 (profile 3). A layer of p-doped semiconductor material 208 is then formed 228 on top of the trench structure (profile 4), and an electrical contact (a Schottky metal in this example) is formed 229 on top of the p-doped semiconductor 208 in the mesa regions 205. As shown in profile 4, the p-doped semiconductor material 208 can be grown selectively on top of the substrate 206 and electrically conductive material 209 but not on the insulating oxide 210. The lattice mismatch and the surface energy of silicon germanium deposited on silicon oxide differ significantly from its deposition on silicon (mono and poly). This can be used to set the growth conditions such that silicon germanium nucleating on top of silicon oxide is etched faster than it can grow, whilst on silicon it grows faster than it is etched. The epitaxial growth of material is a balance of growth and etch, since the process involves multiple chemical reactions taking place at the same time. For example, the evaporation of material from the surface with elevated temperatures is balanced by the partial pressure of the respective source material in order to keep the surface stable. Alternatively, the p-doped semiconductor material 208 may be grown non-selectively and subsequently structured.

Finally, a metallisation step 230 is performed to provide an electrical connection between the termination and active regions of the diode, and a passivation layer is deposited to electrically isolate the structure from the external environment.

FIG. 3 shows a diode structure comprising two trenches formed using the method illustrated in FIG. 2 in which corresponding reference numerals have been used. As can be seen, the p-doped epitaxial layer 308 has grown on the trenches 304 as well as the mesa regions 305 of the structure. In the example illustrated, the p-doped material 308 is silicon germanium and the trenches 304 are formed in monocrystalline silicon 306 and filled with polycrystalline silicon 309. In this scenario, the silicon germanium 308*a* formed in the mesa regions 305 has a monocrystalline structure whilst that 308*b* formed in the trench regions 304 has a polycrystalline structure.

Preferably the monocrystalline 308*a* and polycrystalline 308*b* silicon germanium do not touch one another otherwise they could short circuit the device. To ensure that a short circuit is not created, the lateral growth of the silicon germanium 308*a,b* should be substantially less than half the thickness of the insulating oxide layer 310, as shown in the magnified view of FIG. 3. That is, each of layers 308a,b should overlap less than half of the layer 310 that separates them.

One way of achieving this is to etch the polycrystalline silicon 209/309 (see profile 2 of FIG. 2) until its upper surface 211/311 is positioned sufficiently below the upper surface 212/312 of the monocrystalline silicon 206/306. The extent of this etching step will depend on the thickness of the epitaxial layer of (p-doped and possibly also n-doped) semiconductor material 308a,b to be grown on top of the silicon 306. In some examples, a height difference of at least 10 nm may be appropriate.

Figure 6:
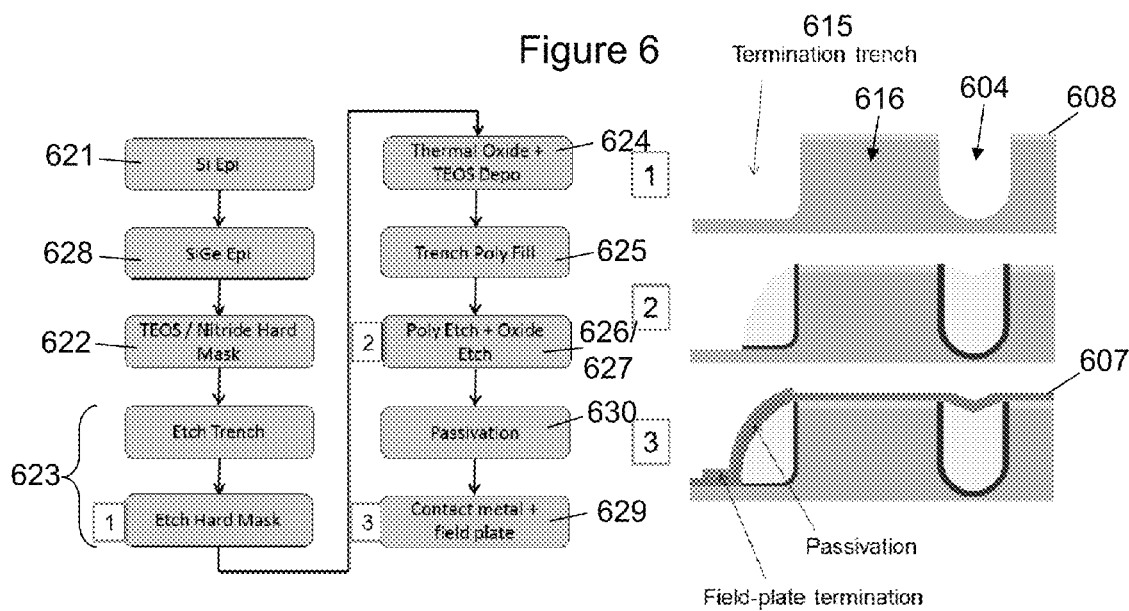
FIG. 6 illustrates schematically another method of making a diode.

There are a number of other ways in which a short circuit created by lateral growth of the p-doped semiconductor material 308a,b may be avoided/addressed. These techniques are shown in FIGS. 4-6. As before, the structural profile has been illustrated schematically following some of the fabrication steps to help visualise the process.

The process of FIG. 4 involves the creation of a guard collar termination region 413 at the edge of the trench 404. A guard collar 413 (also known as a guard ring) renders the edge region of the trench 404 electrically inactive and therefore protects the device against electrical malfunctioning as a result of current leakage at the interface between the mesa region 405 and trench 404. To form the guard collar 413, a p-type dopant is implanted 431 near the surface of the monocrystalline silicon substrate 406 and allowed to diffuse before an etching step 423 is performed to create a trench which is centred at the newly formed dopant region. The other steps of the method are identical to FIG. 2 and will therefore not be described again.

FIG. 5 shows another approach which involves the formation of an oxide layer 510 which extends above the upper surface 512 of the epitaxial silicon layer 506. The protruding oxide 510 physically prevents the p-doped semiconductor 508b of the trench regions 504 from growing laterally into the mesa regions 505 and vice versa. In order to create this surface profile, a hardmask 514 (such as a nitride hardmask) is deposited 532 before the trenches 504 are created 523. The oxide 510 and electrically conductive material 509 (silicon oxide and polycrystalline silicon in this case, respectively) are then deposited 524, 525 on top of the trench 504 and mesa regions 505 resulting in a deeper trench profile than before (compare profile 2 of FIG. 5 with profile 2 of FIG. 2). After etching 526, 527 of the electrically conductive material 509, oxide 510 and hardmask 514, the oxide layer 510 can be seen to protrude from the upper surface 512 of the epitaxial silicon 506. The subsequent steps are the same as before.

In FIG. 5, the polycrystalline silicon 509 can be seen to have a V-shaped profile after the etching step 526 (profile 2). This is merely an artefact of some etching techniques (for example, wet etching) and is not a necessary feature of this embodiment. A flat profile as shown in FIG. 2 may be produced using a different etching technique (for example, dry etching). The same can be said for the V-shaped oxide profile (see profiles 3, 4 and 3 in FIGS. 2, 4 and 5, respectively) following the oxide etching step 527. Furthermore, whilst the polycrystalline silicon 509 can be seen to fill the trench completely in FIG. 5 (see profiles 2-4), a greater polycrystalline etching time could be used to increase the height difference between the upper surfaces 511, 512 of the monocrystalline 506 and polycrystalline 509 silicon to further prevent lateral growth from shorting the device.

FIG. 6 shows another fabrication process designed to prevent shorting. This time, however, the problem is circumvented by forming 628 the p-doped semiconductor layer 608 before creating 622, 623 the trenches 604. In this way, there is no chance of lateral growth because no p-doped semiconductor material 608 is deposited after filling the trenches 604. This figure also shows the formation of a termination trench 615 in the left-hand termination region of the diode structure (see profile 1). The termination trenches 615 are formed so that the electric field distribution in the outermost mesa region 616 is the same as for the other mesa regions 605 and therefore does not compromise the breakdown voltage of the device. As shown in profile 3 of FIG. 6, the electrical contact 607 may be formed 629 as a continuous layer of electrically conductive material (for example, metal, alloy or silicide) to electrically connect the active region of the diode to the left-hand termination region.

Figure 7:
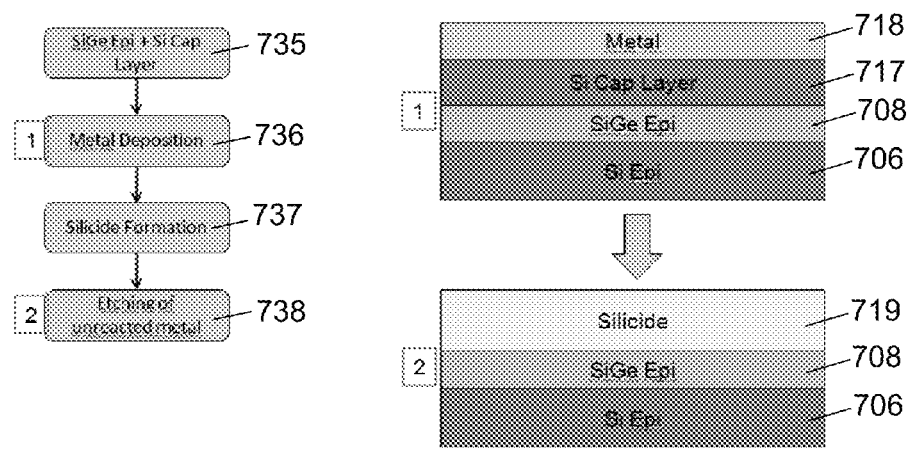
FIG. 7 illustrates schematically a method of making a monosilicide contact.

As mentioned previously, the electrical contact may comprise a metal silicide. FIG. 7 shows how such contacts 719 can be formed on top of an epitaxial layer of p-doped silicon germanium 708. In the example, a silicon cap layer 717 is deposited 735 on top of the silicon germanium 708 followed 736 by a layer of metal 718 (profile 1). When the structure is then annealed 737, the metal 718 and silicon 717 react to create a monosilicide layer 719 (profile 2). During this reaction, the silicon cap layer 717 is completely consumed. The thickness of the metal 718 and silicon cap layer 717 are adjusted so that the silicide formation stops at the interface between the silicon germanium 708 and the silicon cap 717.

Figure 9A:
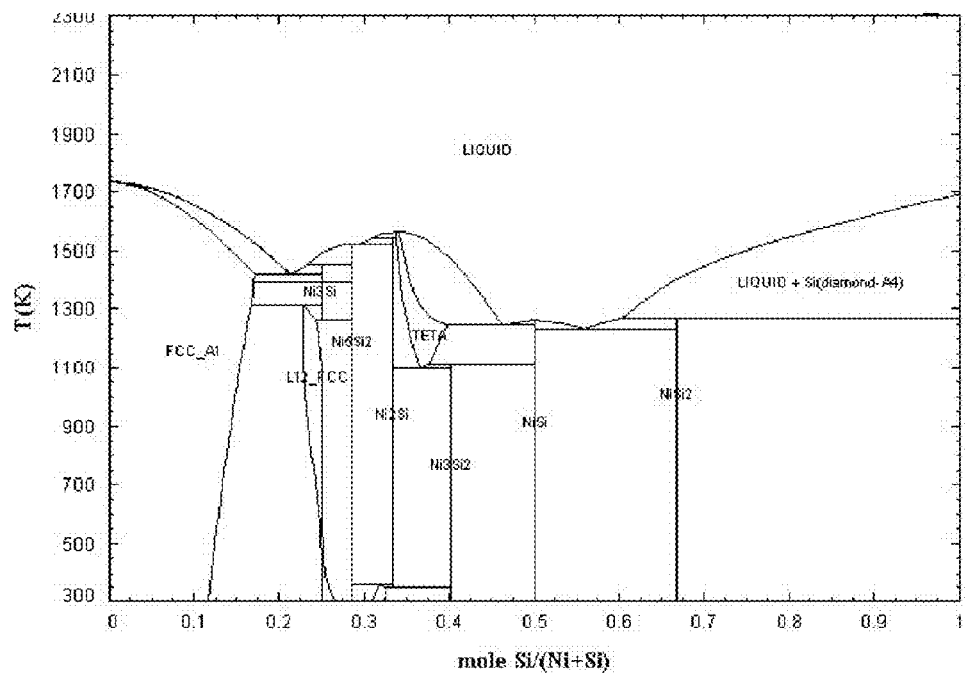
FIG. 9a illustrates graphically the phase diagram of nickel silicide.
Figure 9B:
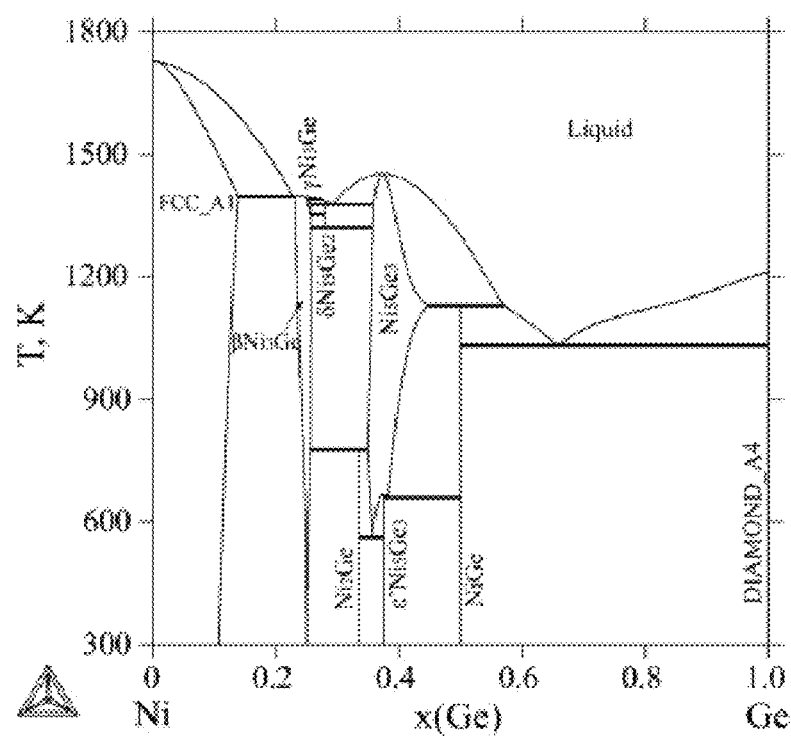
FIG. 9b illustrates graphically the phase diagram of nickel germanide.

Another way of forming a stable silicide contact is by the controlled use of metal-silicide phases such as $CoSi_2$ or $NiSi_2$. In this case, the metal 718 does not react with the silicon germanium 708 because the metal 718 does not form a stable germanide phase. This can be seen, for example, by comparing the nickel silicide phase diagram in FIG. 9a with the nickel germanide phase diagram in FIG. 9b where it is shown that $NiSi_2$ is formed at temperatures of between 700 and 800° C. whilst $NiGe_2$ does not exist as a stable compound. The phase diagrams (not shown) for cobalt silicide and cobalt germanide reveal a similar result. In some cases, there may be some unreacted metal 718 on the upper surface which will need to be removed. This can be done using a standard etching process 738.

Figure 8:
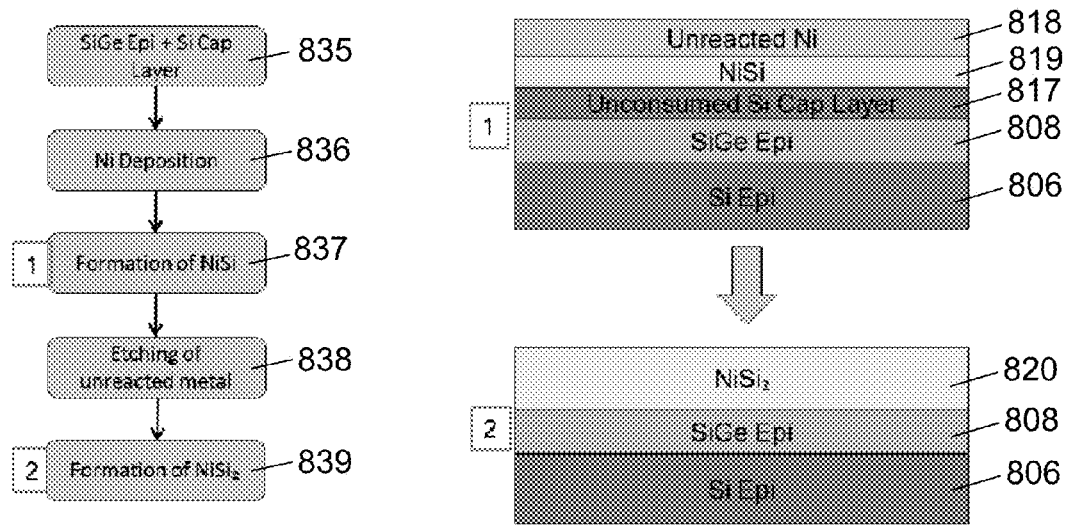
FIG. 8 illustrates schematically a method of making a disilicide contact.

Depending on the specific silicide being formed, the process may require a two-step annealing process. This is illustrated in FIG. 8 for the formation of a nickel silicide contact 820. In this example, a monosilicide 819 is created by the first annealing step 837 (profile 1). The reaction is then stopped before the silicon cap layer 817 is fully consumed so that the silicon germanium 808 is not consumed in the silicide formation process 837. Once the unreacted nickel 818 has been etched away 838, a second annealing step 839 can then be used to convert the nickel monosilicide 819 into nickel disilicide 820 (profile 2).

The invention claimed is:

1. A diode comprising a reduced surface field effect trench structure, the reduced surface field effect trench structure comprising at least two trenches formed in a substrate and separated from one another by a joining region of the substrate, the joining region comprising an electrical contact and a layer of p-doped silicon germanium with a monocrystalline structure, wherein the at least two trenches are covered by a layer of p-doped silicon germanium with a polycrystalline structure, wherein the substrate comprises monocrystalline silicon and each trench comprises polycrystalline silicon separated from the monocrystalline silicon by a layer of silicon oxide, wherein the silicon oxide extends above upper surfaces of the monocrystalline silicon and the polycrystalline silicon, and wherein the silicon oxide has a top end with an angled top surface that extends above an upper surface of the layer of p-doped silicon germanium with the monocrystalline structure and extends below an upper surface of the layer of p-doped silicon germanium with the polycrystalline structure.

2. The diode of claim 1, wherein the joining region further comprises a layer of n-doped semiconductor material.

3. The diode of claim 2, wherein the layer of p-doped silicon germanium with the monocrystalline structure and the layer of n-doped semiconductor material have a combined thickness of no more than 40 nm.

4. The diode of claim 1, wherein the layer of silicon germanium with the monocrystalline structure comprises one or more of p-doped silicon germanium, p-doped silicon, p-doped silicon germanium carbide, and p-doped silicon carbide.

5. The diode of claim 2, wherein the layer of n-doped semiconductor material comprises n-doped silicon germanium.

6. The diode of claim 1, wherein the electrical contact comprises one or more of a metal, an alloy, and a silicide.

7. The diode of claim 1, wherein each trench comprises a guard collar termination region at the edge of the trench.

8. A method of making a reduced surface field effect trench structure for a diode, the method comprising:
   forming at least two trenches in a substrate separated from one another by a joining region of the substrate; and
   forming an electrical contact and a layer of p-doped silicon germanium with a monocrystalline structure at the joining region, wherein the at least two trenches are covered by a layer of p-doped silicon germanium with a polycrystalline structure, wherein the substrate comprises monocrystalline silicon and each trench comprises polycrystalline silicon separated from the monocrystalline silicon by a layer of silicon oxide, wherein the silicon oxide extends above upper surfaces of the monocrystalline silicon and the polycrystalline silicon, and wherein the silicon oxide has a top end with an angled top surface that extends above an upper surface of the layer of p-doped silicon germanium with the monocrystalline structure and extends below an upper surface of the layer of p-doped silicon germanium with the polycrystalline structure.

9. The method of claim 8, wherein the method comprises forming the layer of p-doped silicon germanium with a monocrystalline structure before forming the at least two trenches and electrical contact.

10. The method of claim 8, wherein forming the electrical contact comprises:
    forming a layer of silicon on top of the layer of p-doped silicon germanium with a monocrystalline structure;
    depositing a layer of metal on top of the layer of silicon; and
    annealing the metal and silicon layers to form a monosilicide.

11. The method of claim 10, wherein forming the electrical contact comprises one or both of:
    etching any unreacted metal after forming the monosilicide; and
    annealing the monosilicide to form a disilicide.

12. A computer-readable storage medium containing a computer program comprising computer code, herein execution of the computer code by one or more processors causes the one or more processors to perform one or more method steps of claim 8.

13. The diode of claim 1, wherein the layer of silicon germanium with the monocrystalline structure comprises one or more of p-doped silicon, p-doped silicon germanium carbide, and p-doped silicon carbide.

14. The diode of claim 1, wherein the electrical contact comprises one of an alloy and a silicide.

* * * * *